United States Patent
Iantorno et al.

(10) Patent No.: US 10,353,416 B2
(45) Date of Patent: Jul. 16, 2019

(54) TRIMMING CIRCUIT AND OPERATING METHOD THEREOF

(71) Applicant: SK hynix Inc., Gyeonggi-do (KR)

(72) Inventors: Amedeo Iantorno, Agrate Brianza (IT); Herve Caracciolo, Agrate Brianza (IT)

(73) Assignee: SK hynix Inc., Gyeonggi-do (KR)

( * ) Notice: Subject to any disclaimer, the term of this patent is extended or adjusted under 35 U.S.C. 154(b) by 130 days.

(21) Appl. No.: 15/723,249

(22) Filed: Oct. 3, 2017

(65) Prior Publication Data

US 2018/0101187 A1   Apr. 12, 2018

(30) Foreign Application Priority Data

Oct. 10, 2016   (IT) .................. 102016000101502

(51) Int. Cl.
| | | |
|---|---|---|
| *H03K 5/08* | (2006.01) | |
| *G05F 1/575* | (2006.01) | |
| *G11C 5/14* | (2006.01) | |
| *G11C 16/30* | (2006.01) | |
| *G11C 29/02* | (2006.01) | |

(52) U.S. Cl.
CPC .............. *G05F 1/575* (2013.01); *G11C 5/147* (2013.01); *G11C 16/30* (2013.01); *G11C 29/021* (2013.01); *G11C 29/028* (2013.01); *H03K 5/08* (2013.01)

(58) Field of Classification Search
None
See application file for complete search history.

(56) References Cited

U.S. PATENT DOCUMENTS

| | | | | |
|---|---|---|---|---|
| 8,929,158 | B1* | 1/2015 | Wang ..................... | G11C 5/147 |
| | | | | 365/185.24 |
| 9,356,590 | B1* | 5/2016 | da Silva, Jr. ............ | H03K 5/22 |
| 9,362,936 | B1* | 6/2016 | Caffee .................... | H03K 5/135 |
| 9,784,791 | B2* | 10/2017 | Menon .................... | G01R 31/40 |
| 2002/0153917 | A1 | 10/2002 | Tanaka et al. | |
| 2007/0041261 | A1 | 2/2007 | Oku | |
| 2016/0116925 | A1* | 4/2016 | Freeman ........... | H02M 3/33546 |
| | | | | 307/130 |
| 2018/0091096 | A1* | 3/2018 | Wu .......................... | H03B 5/24 |

OTHER PUBLICATIONS

Extended Search Report Issued by Italian Patent office dated Jul. 4, 2017.

* cited by examiner

*Primary Examiner* — Lincoln D Donovan
*Assistant Examiner* — Khareem E Almo
(74) *Attorney, Agent, or Firm* — IP & T Group LLP

(57) ABSTRACT

Disclosed herein is a method for trimming a voltage regulator by a trimming circuit comprising a voltage divider configured to divide a divide reference voltage according to a divider code and to output a first divider output voltage, a comparator configured to receive the first divider output voltage and a compare reference voltage and to output an output voltage of the comparator by comparing the first divider output voltage and the compare reference voltage and a logic unit configured to output the divider code to the voltage divider and to determine a final divider code based on the output voltage of the comparator.

20 Claims, 13 Drawing Sheets

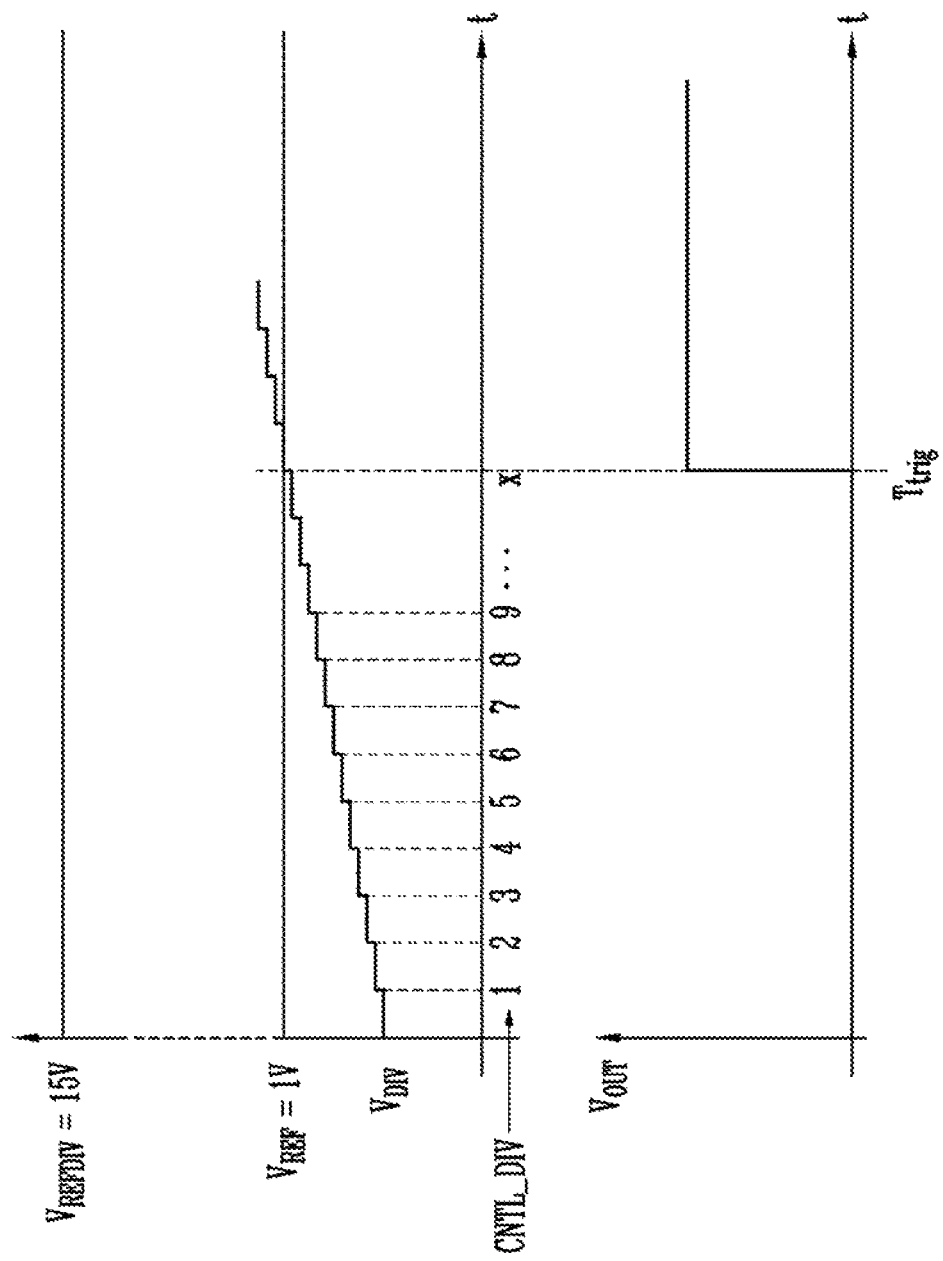

US 10,353,416 B2

TRIMMING CIRCUIT AND OPERATING METHOD THEREOF

CROSS-REFERENCE TO RELATED APPLICATION

The present application claims priority under 35 U.S.C. § 119(a) to Italian patent application number 102016000101502, filed on Oct. 10, 2016, the entire disclosure of which is incorporated herein by reference in its entirety.

TECHNICAL FIELD

The present disclosure relates to a trimming circuit for trimming a voltage regulator and an operating method thereof.

DISCUSSION OF THE RELATED ART

Auto-trim circuit or system can be used to tune internal high voltage (HV) regulators available in a NAND Flash memory to achieve high performances in terms of distributions control and reliability. Auto-trim circuit or system has also the goal to reduce a testing time by tuning many memory devices in a parallel way at the same time. The system uses an external voltage, typically a low voltage, as a reference for internal comparators employed during the regulator measurement.

In general, the external reference voltage has a maximum range, e.g. 12-15V depending on a target apparatus for the test, lower than a voltage of an internal HV regulator, e.g. 20-25V.

The use of low voltage (LV) comparators requires the external reference voltage and the high voltage from a regulator to be divided, so as to guarantee a proper working region of the LV comparators and related LV transistors. It is remarked that a LV comparator is preferred for better performances achievable in a gain stage using LV transistors than using HV transistors.

However, it is well known that the needed dividers, in particular resistor dividers could be affected by a path mismatch, in turn affecting the voltage regulator tuning.

FIG. 1A shows a circuit 50 for trimming a voltage regulator. FIG. 1B shows the circuit 50 for trimming a voltage regulator when inputs of the circuit 50 of FIG. 1A are inverted by a switching block 20.

The circuit 50 comprises a first resistor path 30-1 and a second resistor path 30-2, each resistor path acting as a voltage divider. The circuit 50 further comprises a switching block 20 and a comparator 10, connected in cascade with the first and second resistor paths 30-1 and 30-2. In particular, the comparator 10 is a LV comparator. An external voltage reference VEXTPAD is provided to the second resistor path 30-2, while an internal HV voltage reference VMEAS is provided to the first resistor path 30-1.

The value of the external voltage reference VEXTPAD is limited by a maximum voltage of a target apparatus for the test, i.e. an upper bound of 15V.

The internal HV voltage reference VMEAS, which is to be tuned, is compared with the external voltage reference VEXTPAD, and is set equal to a target value of the regulator trimming voltage, namely, VMEAS=VEXTPAD. It is needed to scale down the high voltage values to use the low voltage comparator 10. If the target value of the regulator trimming voltage is equal to or less than 15V, the first and second resistor paths 30-1 and 30-2 have a same topology and respectively comprise first variable resistors R1-1 and R1-2 to catch different trimming voltage target values.

To minimize the offset error of the comparator 10, two steps of measurements of the HV internal voltage VMEAS are performed by the circuit 50, namely by inverting inputs of the comparator to minimize such an offset error, as shown in FIGS. 1A and 1B.

In case there is a resistor mismatch in two resistor paths 30-1 and 30-2, the measure of the internal HV voltage reference VMEAS of the regulator and the external voltage reference VEXTPAD can be severely affected by an error caused due to the resistor mismatch. If the first variable resistor R1-1 of the first resistor path 30-1 and the first variable resistor R1-2 of the second resistor path 30-2 have different values, being chosen to match respective voltage levels of the internal HV voltage reference VMEAS and the external voltage reference VEXTPAD, namely, the two resistor paths have different configurations and the voltage ratio is not the same in the two resistor paths 30-1 and 30-2, the mismatch can be even higher.

Therefore, there is a need to solve the problem of resistor mismatch in auto-trimming system.

SUMMARY

Embodiments of the invention are directed to a trimming circuit for trimming a voltage regulator and an operating method thereof.

The aim of the proposed novel method and trimming circuit is to reduce the error caused by mismatches in resistor paths and to improve the preciseness of a trimming process for voltage regulators, particularly used in NAND flash memory.

In an embodiment of the invention, a method for trimming a voltage regulator by a trimming circuit comprising a comparator and a voltage divider, the voltage divider being inserted between the voltage regulator and the comparator and connected thereto, comprises: tuning a division ratio of the voltage divider based on a first reference voltage and a second reference voltage to determine a final division ratio of the voltage divider, the voltage divider being adapted to receive the first reference voltage and to divide the first reference voltage based on the final division ratio to output a first divider output voltage, the comparator being adapted to receive at its input the second reference voltage and the first reference voltage as divided; and trimming the voltage regulator by varying an output voltage of the voltage regulator and applying it to the voltage divider to determine a final trimmed value of the output voltage, the comparator being adapted to receive at its input a trimming reference voltage and a second divider output voltage, the second divider output voltage being a voltage from the voltage divider divided from the output voltage of the voltage regulator by the final division ratio.

According to another embodiment of the invention, a trimming circuit for trimming a voltage regulator comprises a voltage divider, coupled between the voltage regulator and a comparator, as well as a logic block, coupled between the voltage regulator and the voltage divider and connected to the comparator, the logic block being adapted to control a division ratio of the voltage divider and to control the voltage regulator, the comparator being adapted to receive interchangeably an output voltage of the voltage divider and a reference voltage to output a comparison result to the logic block.

According to another embodiment of the invention, an operation method of a trimming circuit for a voltage regulator comprising a comparator and a voltage divider, the voltage divider being inserted between the voltage regulator and the comparator and connected thereto, the method comprises: determining a final divider code for the voltage divider by comparing a first divider output voltage and a compare reference voltage and determining a final regulator code for the voltage regulator by comparing a second divider output voltage and a trimming reference voltage, wherein the first divider output voltage is generated by dividing a divide reference voltage according to a divider code inputted to the voltage divider, and the second divider output is generated by dividing an output voltage of the voltage regulator according to the final divider code.

According to another embodiment of the invention, a trimming circuit for a voltage regulator comprises a voltage divider configured to divide a divide reference voltage according to a divider code and to output a first divider output voltage, a comparator configured to receive the first divider output voltage and a compare reference voltage and to output an output voltage of the comparator by comparing the first divider output voltage and the compare reference voltage and a logic unit configured to output the divider code to the voltage divider and to determine a final divider code based on the output voltage of the comparator, wherein voltage divider further configured to divide an output voltage of the voltage regulator according to the final divider code and to output a second divider output voltage, wherein the comparator further configured to receive the second divider output voltage and a trimming reference voltage and to output the output voltage of the comparator by comparing the second divider output voltage and the trimming reference voltage, and wherein the logic unit further configured to output the final divider code to the voltage divider, to output a regulator code to the voltage regulator and to determine a final regulator code based on the output voltage of the comparator.

BRIEF DESCRIPTION OF THE DRAWINGS

The characteristics and advantages of the disclosure will be apparent from the following description of embodiments thereof given by way of indicative and non-limiting example with reference to the annexed drawings as follows.

FIG. 4B schematically shows a voltage level of each component in the trimming circuit of FIG. 4A.

DETAILED DESCRIPTION

Figure 1A:
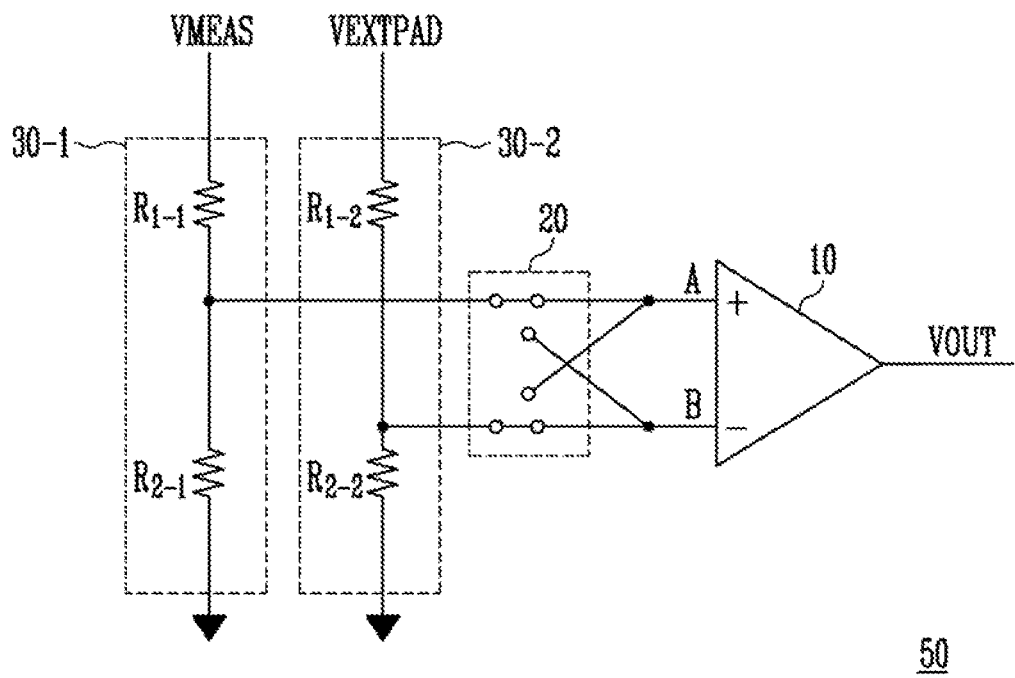
FIG. 1A shows a circuit for trimming a voltage regulator.
Figure 1B:
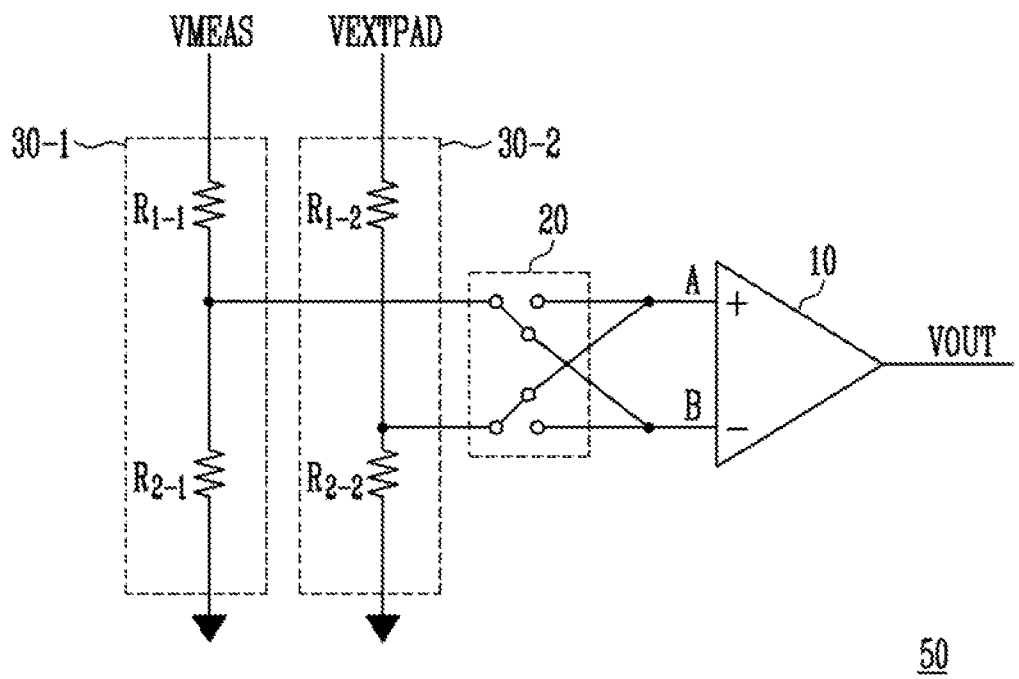
FIG. 1B shows a circuit for trimming a voltage regulator when inputs of the circuit of FIG. 1A are inverted.

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention. The terms and words used in the specification and claims should not be construed as their ordinary or dictionary sense. On the basis of the principle that the inventor can define the appropriate concept of a term in order to describe his/her own invention in the best way, it should be construed as a meaning and concepts for complying with the technical idea of the present invention. In addition, detailed descriptions of constructions well known in the art may be omitted to avoid unnecessarily obscuring the gist of the present invention.

In this specification, the terms "trimming" and "tuning" may be used interchangeably.

In the drawings, corresponding features are identified by the same reference numerals.

Figure 2:
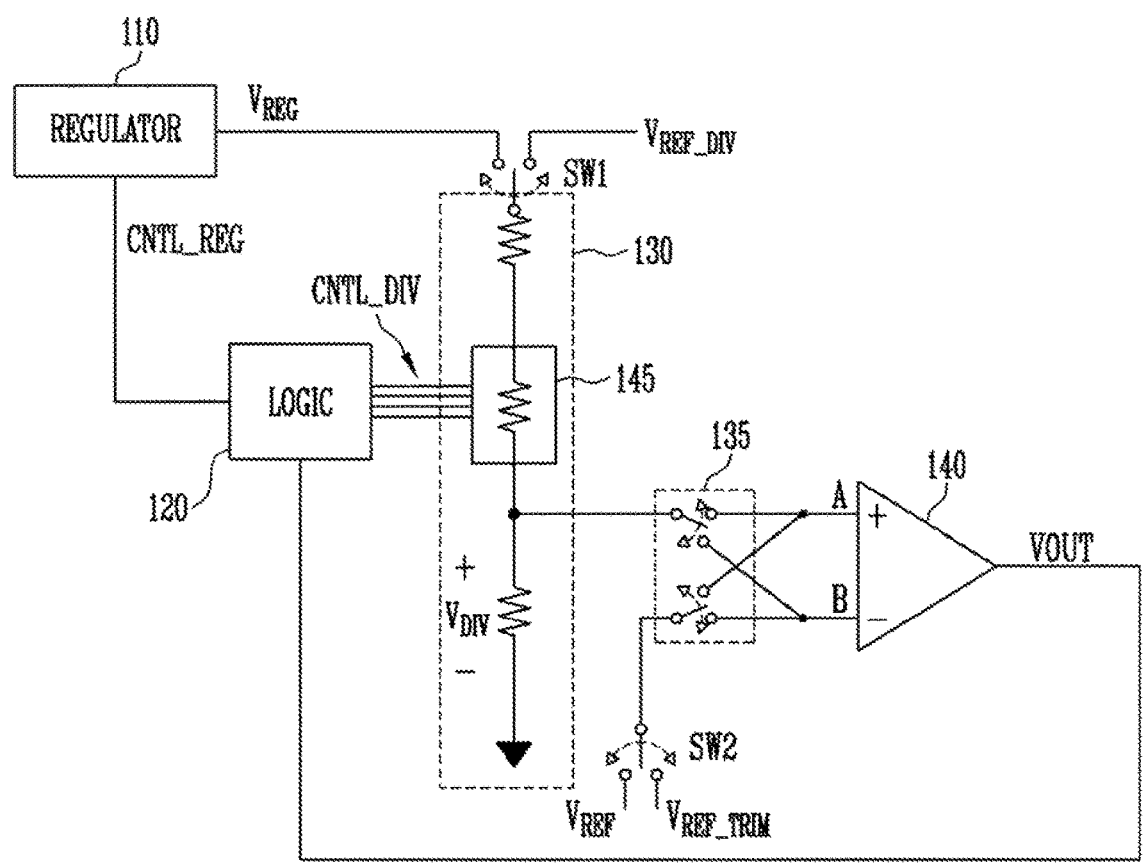
FIG. 2 shows a trimming circuit according to an embodiment of the present invention.

FIG. 2 shows a trimming circuit 100 according to an embodiment of the present invention.

Hereinafter, the structure of the trimming circuit 100 in FIG. 2 is briefly explained first, and then the operation of the same will be explained in reference to FIGS. 3 to 7.

The trimming circuit 100 is connected to a voltage regulator 110, and comprises at least a voltage divider 130 and a comparator 140, the voltage divider 130 being inserted between the voltage regulator 110 and the comparator 140 and connected thereto. Moreover, the trimming circuit 100 comprises a logic block 120 and a switching block 135

More particularly, the voltage regulator 110 has an input terminal connected to the logic block 120 and receiving therethrough a regulator code CNTL_REG. The logic block 120 has a further output terminal connected to the voltage divider 130 for providing a divider code CNTL_DIV thereto. The voltage divider 130 is coupled between a switching element SW1 and a voltage reference (e.g., a ground), and has an output terminal connected, through the switching block 135, to the comparator 140, which has in turn an output terminal connected to an input terminal of the logic block 120. The switching element SW1 is interchangeably connected to an output voltage $V_{REG}$ received from the voltage regulator 110 and a divider reference voltage $V_{REF\_DIV}$.

In this way, the logic block 120 is adapted to control a division ratio of the voltage divider 130. For example, the logic block 120 can adjust the division ratio of the voltage divider 130 by controlling the divider code CNTL_DIV inputted to the voltage divider 130.

The logic block 120 is also adapted to control the voltage regulator 110. For example, the logic block 120 can vary the regulator code CNTL_REG to control the output voltage $V_{REG}$ Of the voltage regulator 110.

The voltage divider 130 can receive an input selectively between the output voltage $V_{REG}$ of the voltage regulator 110 and a first reference voltage or a divider reference voltage $V_{REF\_DIV}$ through the switching element SW1. In the embodiment, the voltage divider 130 is a resistive divider, but the embodiment is not limited thereto. Alternatively, the voltage divider 130 may be a capacitive divider, or a diode divider, or a transistor divider. In the embodiment, the voltage divider 130 comprises a variable resistor 145. The logic block 120 inputs the divider code CNTL_DIV to the variable resistor 145 so as to vary the division ratio of the voltage divider 130.

The comparator 140 is adapted to receive interchangeably an output of the voltage divider 130 and a second reference voltage, i.e. a comparator reference voltage $V_{REF}$ or a trimming reference voltage $V_{REF\_TRIM}$, by means of a further switching element SW2, and it is adapted to output a comparison result to the logic block 120 as an output voltage $V_{OUT}$. The switching block 135 is arranged between the voltage divider 130 and the comparator 140 such that the inputs of the comparator 140 may be inverted.

One of the comparator reference voltage $V_{REF}$ and the trimming reference voltage $V_{REF\_TRIM}$ can be chosen as the input to the comparator 140 by the further switching element SW2 and the switching block 135.

The trimming method of the voltage regulator 110 according to the embodiment basically comprises two steps, a first step of tuning a division ratio of a voltage divider 130 and a second step of trimming the voltage regulator 110 by using the same voltage divider 130. The details of the method will be explained below.

Figure 3:
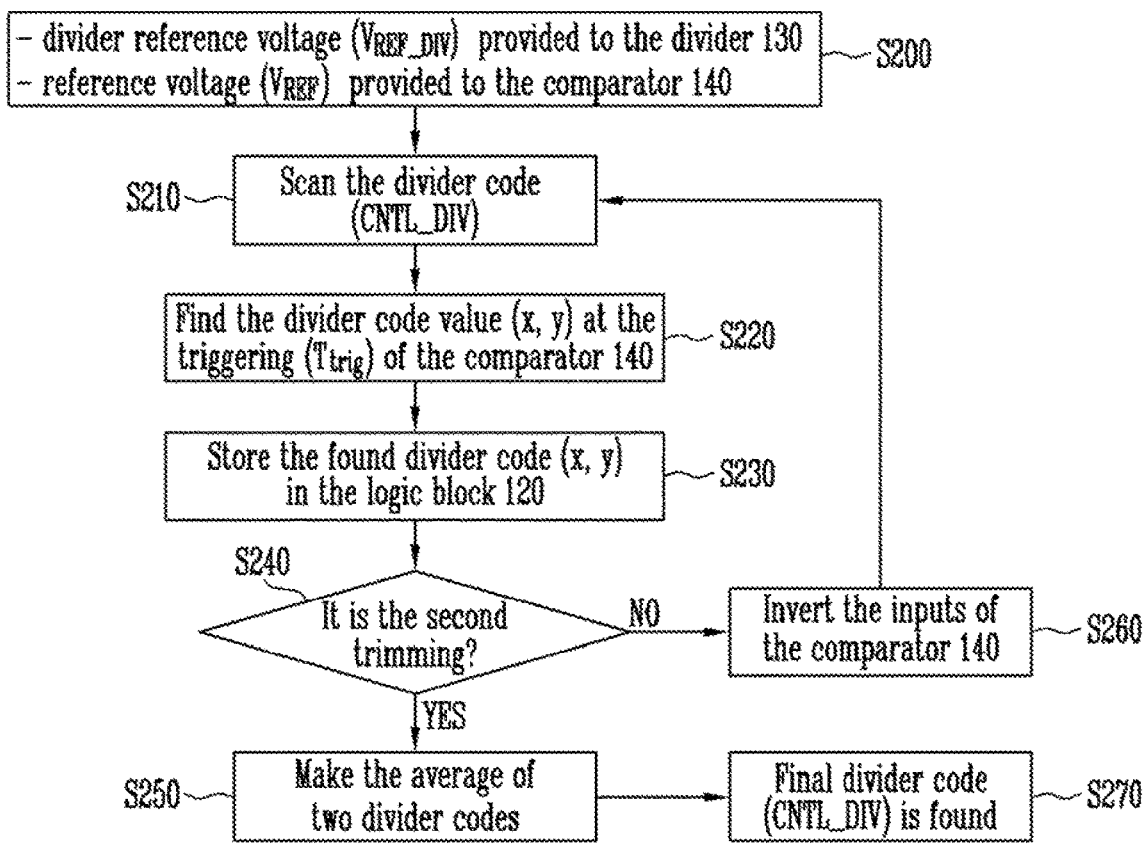
FIG. 3 shows a flow chart describing an operation of tuning a voltage division ratio of a voltage divider of the trimming circuit according to the embodiment of FIG. 2.

FIG. 3 shows a flow chart describing steps of tuning a division ratio of the voltage divider 130 according to an embodiment of the present invention.

Figure 4A:
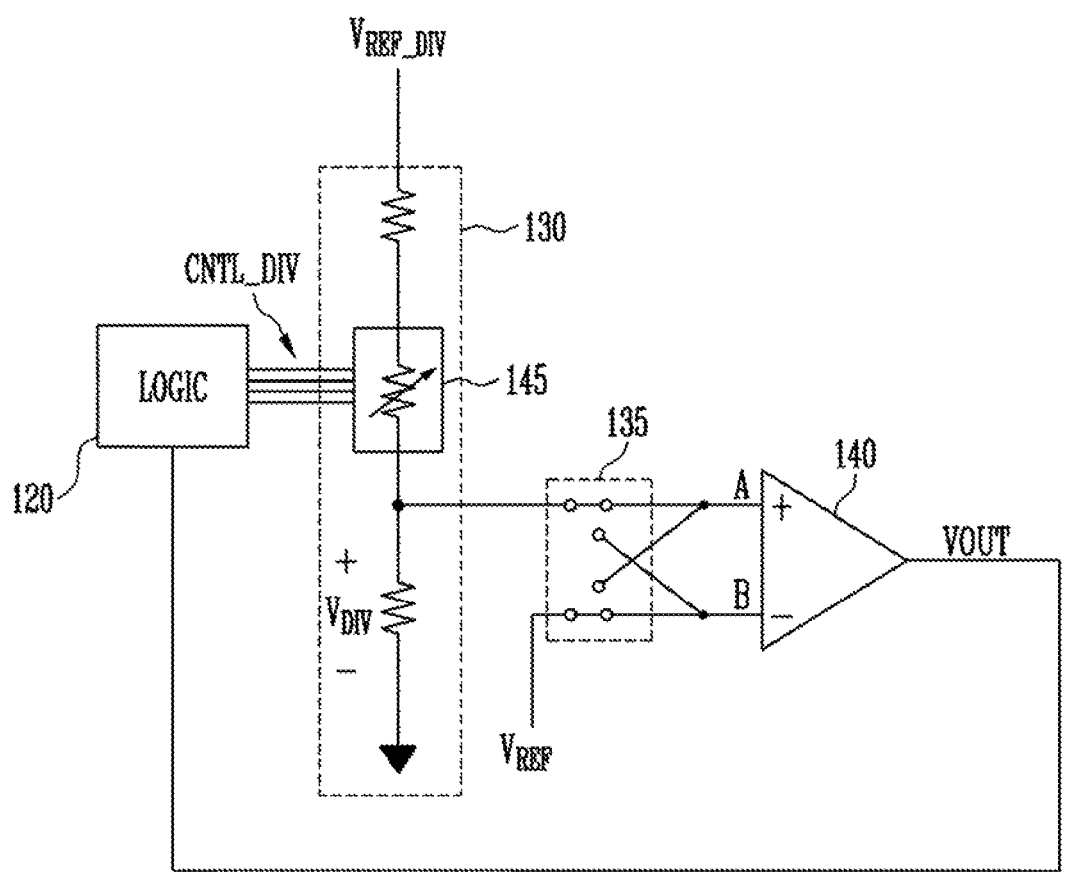
FIG. 4A schematically shows the trimming circuit of FIG. 2 in a working condition.

FIG. 4A schematically shows the configuration of the trimming circuit, indicated as 100-1, in a working condition wherein when a first tuning of the resistors of the voltage divider 130 is performed. In FIG. 4A, the voltage regulator 110 and the switching elements SW1 and SW2 are omitted for sake of simplicity.

At the step S200, the divider reference voltage $V_{REF\_DIV}$ is applied to the voltage divider 130, and the comparator reference voltage $V_{REF}$ is applied to the comparator 140. As shown in FIG. 4A, the switching block 135 is adjusted such that a divider output voltage $V_{DIV}$ of the voltage divider 130 is applied to the non-inverting (+) input A of the comparator 140, while the comparator reference voltage $V_{REF}$ is applied to the inverting (−) input B of the comparator 140. The switching element SWL is switched such that the divider reference voltage $V_{REF\_DIV}$ is applied to the voltage divider 130 and the further switching element SW2 is switched so as to apply the comparator reference voltage $V_{REF}$ to the switching block 135.

Then, at the step S210, scanning of the divider code CNTL_DIV, which is a trimming value of the voltage comparator 140, is performed. This process is carried out by varying the value of such a divider code CNTL_DIV provided to the variable resistor 145 of the voltage divider 130. Then, at the step S220, at a triggering point $T_{trig}$ of the comparator 140, a triggering value can be found for the divider code CNTL_DIV.

FIG. 4B schematically shows a voltage level of each component of the trimming circuit 100-1 in the working condition of FIG. 4A, i.e. when the first tuning of the resistors of the voltage divider 130 is performed. In the example, the divider reference voltage $V_{REF\_DIV}$ is 15V, and the comparator reference voltage $V_{REF}$ is 1V. The specific levels of these reference voltages may vary depending on the specific embodiments.

The scanning of the divider code CNTL_DIV is performed, for example, by gradually or step-wisely increasing the divider output voltage $V_{DIV}$ of the voltage divider 130, which can be achieved by increasing the value of the divider code CNTL_DIV from 1. In the embodiment, the variable resistor 145 has a highest resistance value when the divider code CNTL_DIV is 1. Alternatively, different code schemes may be used, and the embodiment can be modified appropriately. The divider code CNTL_DIV may be a bit code.

When the divider output voltage $V_{DIV}$ of the voltage divider 130 is lower than the comparator reference value $V_{REF}$, the output voltage $V_{OUT}$ of the comparator 140 is low. When the divider output voltage $V_{DIV}$ of the voltage divider 130 is higher than the comparator reference value $V_{REF}$, the output voltage $V_{OUT}$ of the comparator 140 is high. The triggering point $T_{trig}$ is where the output voltage $V_{OUT}$ of the comparator 140 transits from low to high. Alternatively, the triggering point $T_{trig}$ may be defined as a point where the output voltage $V_{OUT}$ of the comparator 140 transits from high to low.

Referring back to FIG. 3, at the step S230, a first value x of the divider code CNTL_DIV as found is stored in the logic block 120; in particular, when the divider code CNTL_DIV is equal to this first value x the comparator 140 triggers, i.e. its output voltage $V_{OUT}$ transits from low to high. Then, at the step S240, the process transits to step S260, since in this case there has been only the first tuning.

Figure 5A:
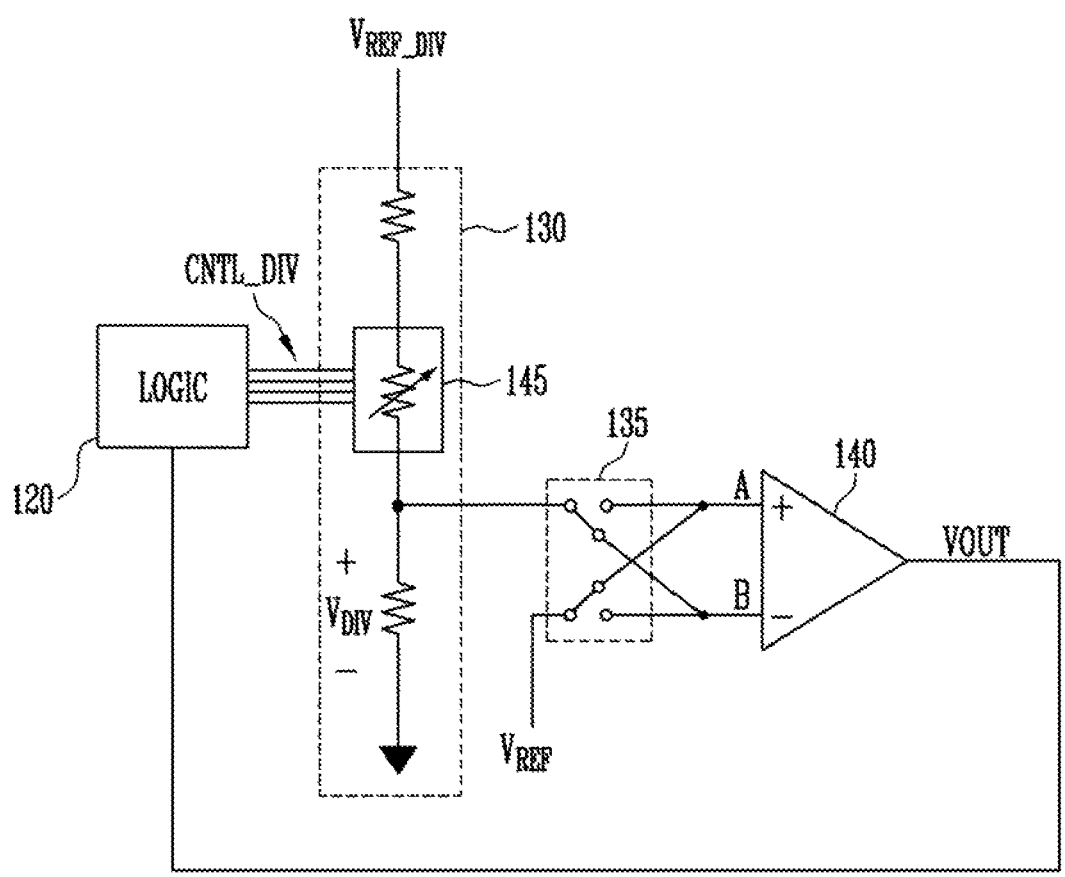
FIG. 5A schematically shows the trimming circuit of FIG. 2 in another working condition.
Figure 5B:
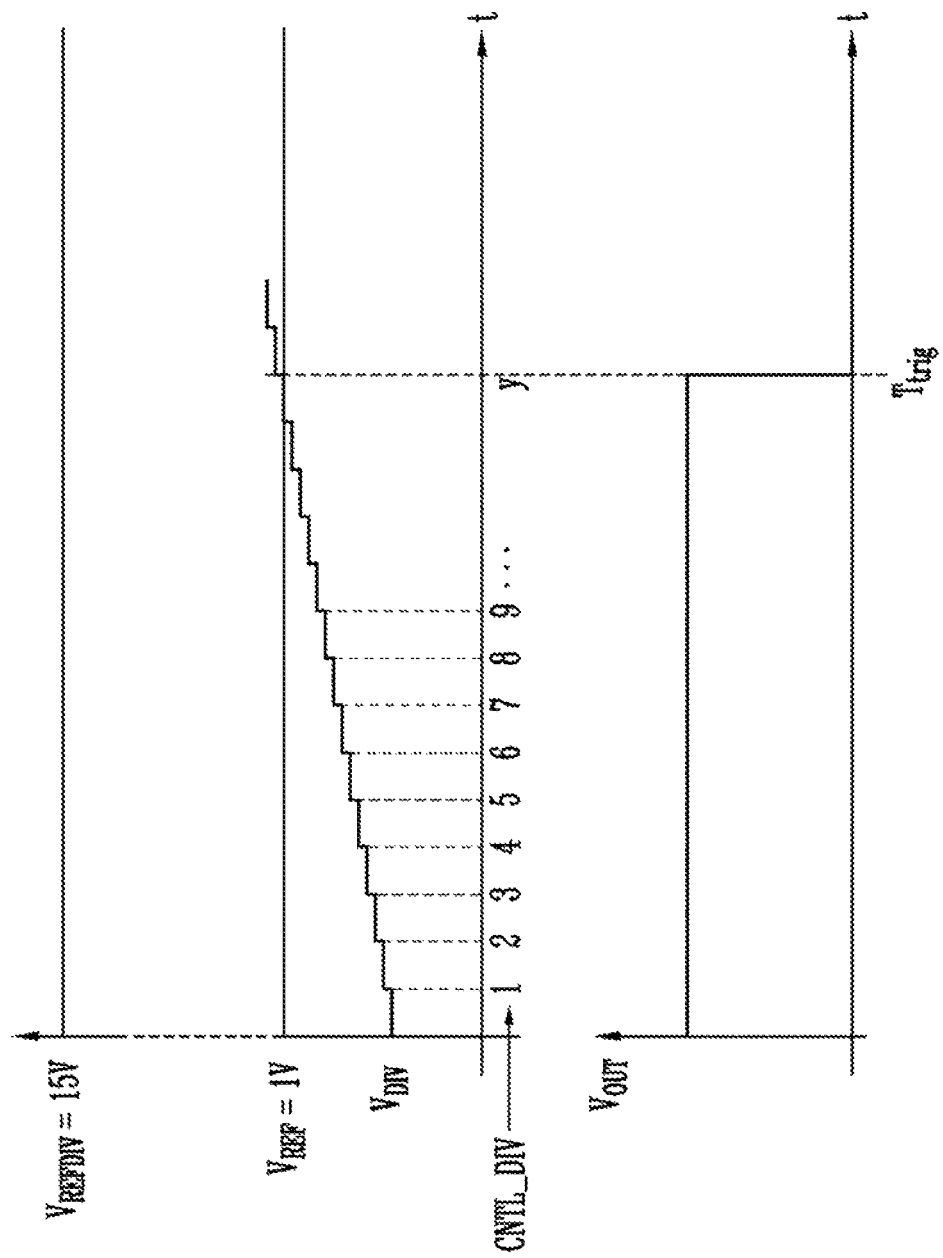
FIG. 5B schematically shows a voltage level of each component in the trimming circuit of FIG. 5A.

FIG. 5A schematically shows the configuration of the trimming circuit, indicated as 100-2, in a further working condition wherein a second tuning of the resistors of the voltage divider 130 is performed. In FIG. 5A, the regulator 140 and the switching elements SW1 and SW2 are omitted for sake of simplicity.

Referring back to FIG. 3, at the step S260, the signals applied to the inputs of the comparator 140 are inverted by the switching block 135. More particularly, as shown in FIG. 5A, the switching block 135 is adjusted such that the divider output voltage $V_{DIV}$ of the voltage divider 130 is applied to the inverting input B of the comparator 140 while the comparator reference voltage $V_{REF}$ is applied to the non-inverting input A of the comparator 140. The switching element SW1 is still switched such that the divider reference voltage $V_{REF\_DIV}$ is applied to the input of the voltage divider 130 and the further switching element SW2 is still switched so as to apply the comparator reference voltage $V_{REF}$ to the switching block 135.

Then, the process transits to the step S210, wherein the scanning of the divider code CNTL_DIV is performed, as above explained. This scanning is more particularly carried out by varying the divider code CNTL_DIV provided to the variable resistor 145 of the voltage divider 130. Then, at the step S220, a further value y of the divider code CNTL_DIV can be found at a triggering point of the comparator 140.

FIG. 5S schematically shows the voltage level of each component of the trimming circuit 100-2 in the working condition of FIG. 5A, i.e. when the second tuning of the resistors of the voltage divider 130 is performed. The scanning of the divider code CNTL_DIV is performed, for example, by gradually or step-wisely increasing the divider output voltage $V_{DIV}$ of the voltage divider 130, which can be achieved, as previously, by increasing the value of the divider code CNTL_DIV from 1. In the embodiment, the variable resistor 145 has a highest resistance when the divider code CNTL_DIV is 1. Alternatively, different code schemes may be used, and the embodiment can be modified appropriately.

When the divider output voltage $V_{DIV}$ of the voltage divider 130 is lower than the reference value $V_{REF}$, the output voltage $V_{OUT}$ of the comparator 140 is high. When the divider output voltage $V_{DIV}$ of the voltage divider 130 is higher than the reference value $V_{REF}$, the output voltage $V_{OUT}$ of the comparator 140 is low. The triggering point $T_{trig}$ is where the output voltage $V_{OUT}$ of the comparator 140 transits from high to low. Alternatively, the triggering point Ttrig may be defined as a point where the output voltage $V_{OUT}$ of the comparator 140 transits from low to high.

Referring back to FIG. 3, at the step S230, the further value y of the divider code CNTL_DIV as found is stored in the logic block 120; in particular, when the divider code CNTL_DIV is equal to the further value y the comparator 140 triggers, i.e. its output voltage VOUT transits from high to low. Then, at the step S240, the process transits to step S250, since the previous step has been the second trimming.

Then, at the step S250, the average of the two divider codes x and y is calculated, and this calculated value becomes a final value of the divider code CNTL_DIV at the step S270, which is set as a fixed divider code CNTL_DIV for a next regulator trimming processes.

The comparator's input scrambling allows minimizing the comparator offset error, where a double measure is performed by inverting the inputs of the comparator 140 thanks to the switching block 135.

Figure 6:
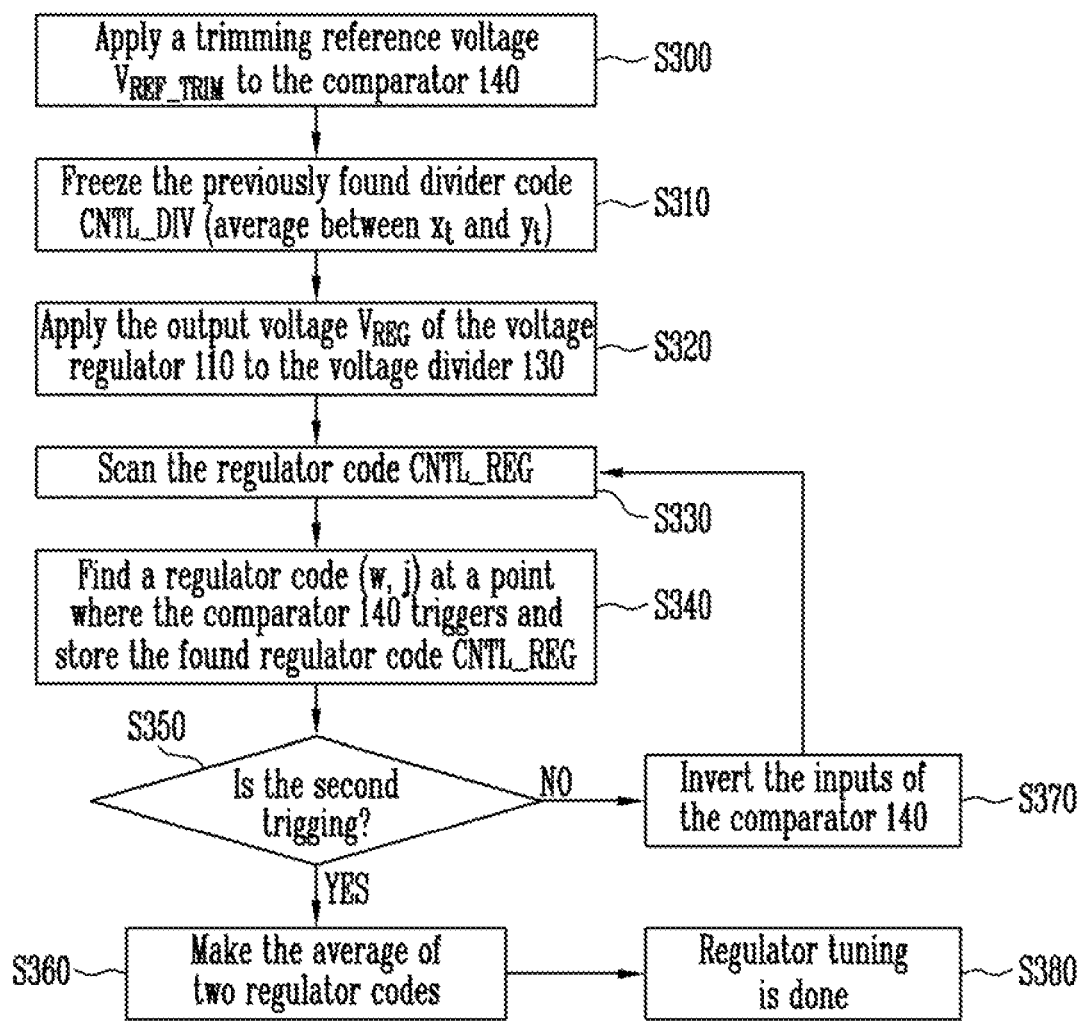
FIG. 6 shows a flow chart describing steps of a regulator trimming process according to an embodiment of the present invention.

FIG. 6 shows a flow chart describing steps of trimming the regulator according to an embodiment of the present invention.

Figure 7A:
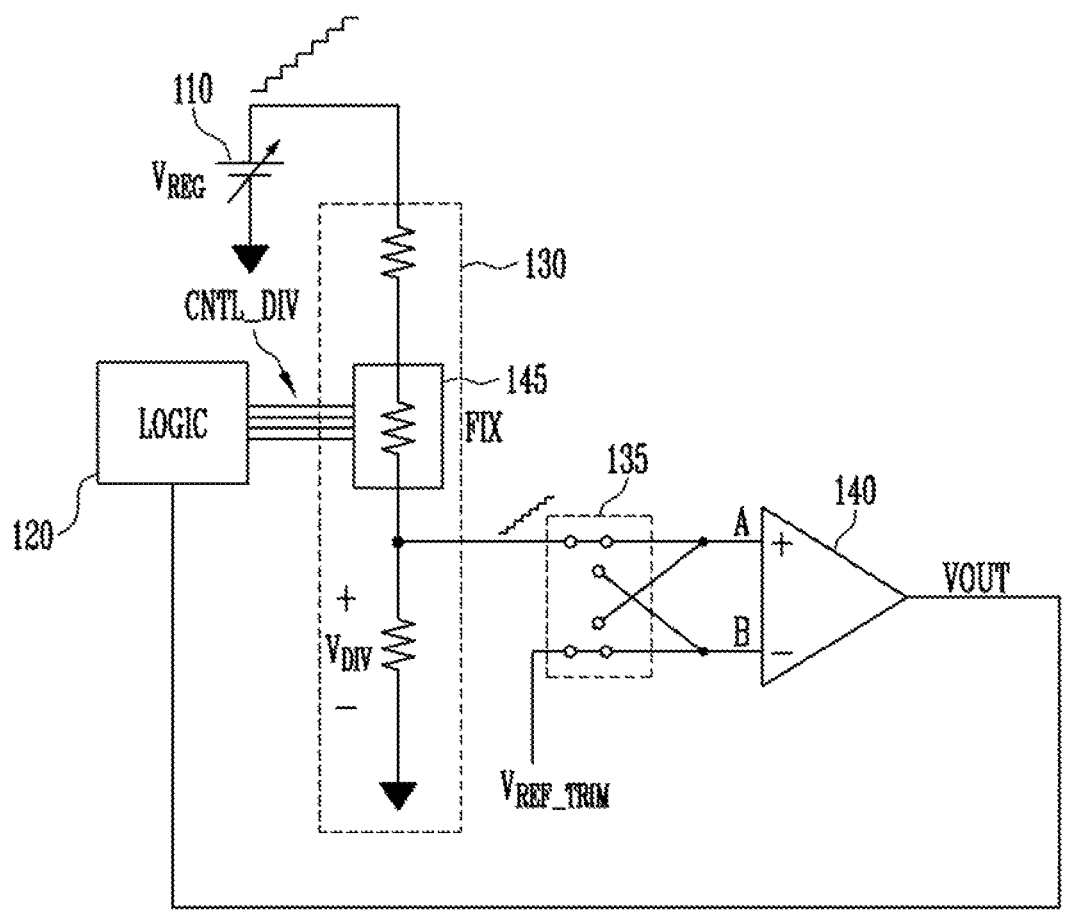
FIG. 7A schematically shows the trimming circuit of FIG. 2 in a further working condition.

FIG. 7A schematically shows the configuration of the trimming circuit, indicated as 100-3, in a working condition wherein a first trimming step for the voltage regulator 110 is performed. In FIG. 7A, the switching elements SW1 and SW2 are omitted for sake of simplicity and the voltage regulator 110 is indicated as a variable voltage generator apt to provide a gradually or step-wisely increasing output voltage $V_{REG}$. The switching element SW1 is switched such that the output voltage $V_{REG}$ of the voltage regulator 110 is applied to the voltage divider 130 and the further switching element SW2 is switched so as to apply the trimming reference voltage $V_{REF\_TRIM}$ to the switching block 135.

Referring back to FIG. 6, at the step S300, the trimming reference voltage $V_{REF\_TRIM}$ is applied to the inverting input B of the comparator 140. As shown in FIG. 7A, the switching block 135 is adjusted such that the divider output voltage $V_{DIV}$ of the voltage divider 130 is applied to the non-inverting input A of the comparator 140, while the trimming reference voltage $V_{REF\_TRIM}$ is applied to the inverting input B of the comparator 140.

Then, at the step S310, the divider code CNTL_DIV for the voltage divider 130 is frozen as the previously found divider code CNTL_DIV, i.e. the average of x and y.

At the step S320, the switching element SW1 (not shown) is switched such that the regulator voltage $V_{REG}$ is applied to the voltage divider 130.

The initial steps S300, S310, S320, also indicated as setting steps, may be performed in a different order.

At the step S330, the regulator code CNTL_REG is scanned. Then, at the step S340, a first value w of the regulator code CNTL_REG is found at a point where the comparator 140 triggers, and the found first value w is stored in the logic block 120.

Figure 7B:
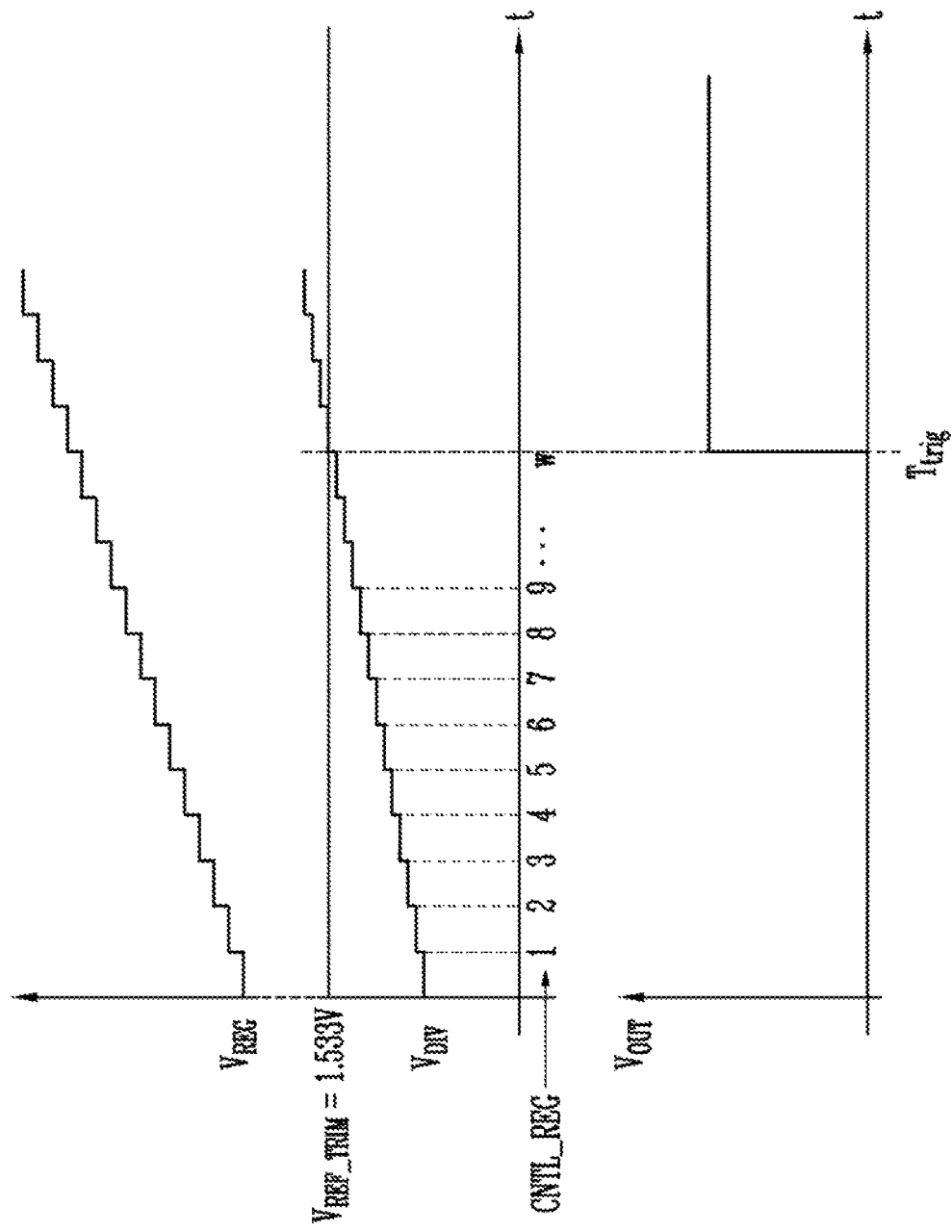
FIG. 7B schematically shows a voltage level of each component in the trimming circuit shown in FIG. 7A.

FIG. 7B schematically shows the voltage level of each component of the trimming circuit 100-3 in the working condition of FIG. 7A, i.e. when the first trimming of the voltage regulator 110 is performed. The scanning of the regulator code CNTL_REG is performed, for example, by gradually or step-wisely increasing the output voltage $V_{REG}$ of the voltage regulator 110, which can be achieved by adjusting the regulator code CNTL_DIV. In the embodiment, the output voltage $V_{REG}$ of the voltage regulator 110 increases as the regulator code CNTL_REG increases. For each value of the regulator code CNTL_REG of the voltage regulator 110, there is a corresponding value of the output voltage $V_{REG}$. Alternatively, different code schemes for the regulator code CNTL_REG may be used, and the embodiment can be modified appropriately.

When the divider output voltage $V_{DIV}$ of the voltage divider 130 is lower than the trimming reference value $V_{REF\_TRIM}$, the output voltage $V_{OUT}$ of the comparator 140 is low. When the divider output voltage $V_{DIV}$ of the voltage divider 130 is higher than the trimming reference value $V_{REF\_TRIM}$, the output voltage $V_{OUT}$ of the comparator 140 is high. The triggering point $T_{trig}$ is where the output voltage $V_{OUT}$ of the comparator 140 transits from low to high. Alternatively, the triggering point $T_{trig}$ may be defined as a point where the output voltage $V_{OUT}$ of the comparator 140 transits from high to low.

In FIG. 7B, the output voltage $V_{OUT}$ of the comparator 140 is kept as low at the beginning, and the output voltage $V_{OUT}$ of the comparator 140 transits to high at a point when the divider output voltage $V_{DIV}$ of the voltage divider 130 becomes higher than the trimming reference voltage $V_{REF\_TRIM}$. This triggering occurs when the regulator code CNTL_REG is equal to w. In the embodiment, the trimming reference voltage $V_{REF\_TRIM}$ is, for example, 1.5333V.

Referring back to FIG. 6, at the step S340, the first value w of the regulator code CNTL_REG as found for the voltage regulator 110 is stored in the logic block 120; in particular, when the regulator code CNTL_REG is equal to the first value w the comparator 140 triggers, i.e. transits from low to high. Then, at the step S350, the process transits to the step S370, since in this case there has been only the first trimming process.

Figure 8A:
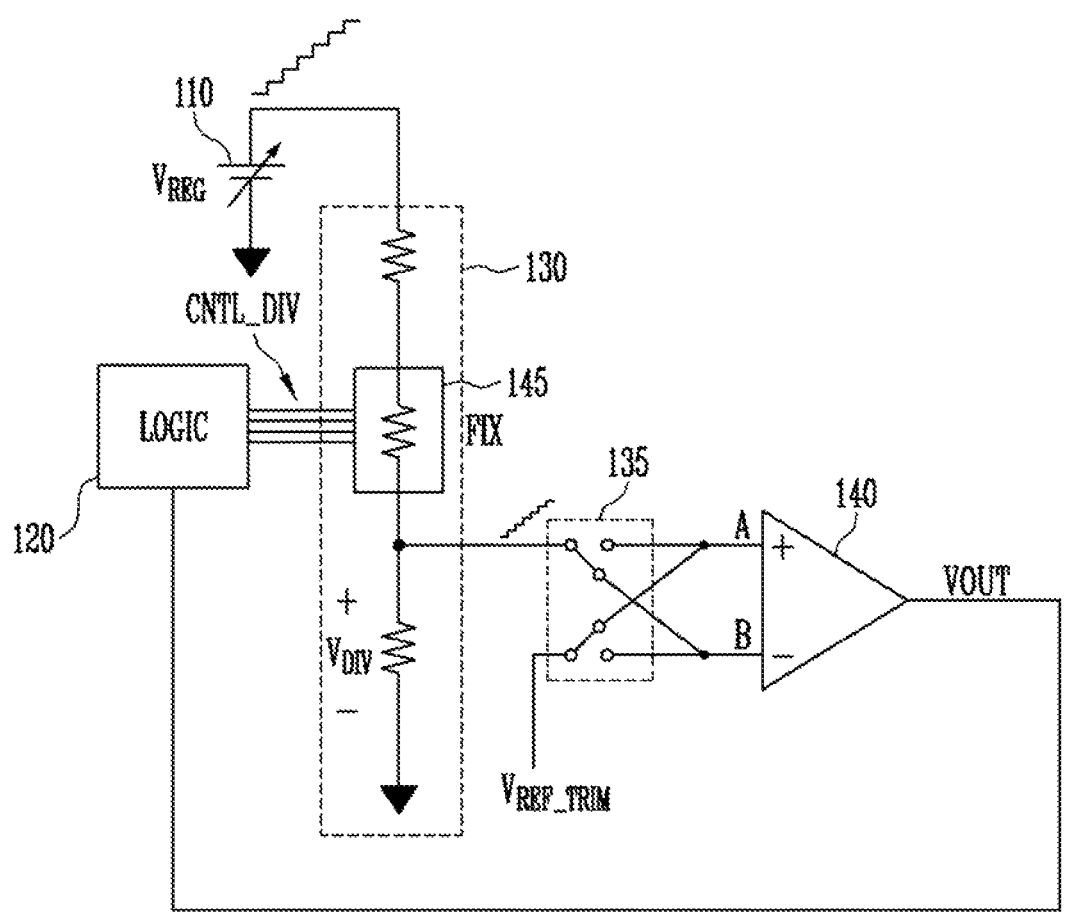
FIG. 8A schematically shows the trimming circuit of FIG. 2 in a yet another working condition.

FIG. 8A schematically shows the configuration of the trimming circuit, indicated as 100-4, in a further working condition wherein a second trimming process for the voltage regulator 110 is performed. In FIG. 8A, the switching elements SW1 and SW2 are omitted for sake of simplicity and the voltage regulator 110 is indicated as a variable voltage generator apt to provide a gradually or step-wisely increasing output voltage $V_{REG}$. The switching element SW1 is switched such that the output voltage $V_{REG}$ of the voltage regulator 110 is applied to the voltage divider 130 and the further switching element SW2 is switched so as to apply the trimming reference voltage $V_{REF\_TRIM}$ to the switching block 135.

Referring back to FIG. 6, at the step S370, the signals applied to the inputs of the comparator 140 are inverted by the switching block 135. More particularly, as shown in FIG. 8A, the switching block 135 is adjusted such that the divider output voltage $V_{DIV}$ of the voltage divider 130 is applied to the inverting input B of the comparator 140 while the trimming reference voltage $V_{REF\_TRIM}$ is applied to the non-inverting input A of the comparator 140.

At the step S330, the regulator code CNTL_REG is scanned. Then, at the step S340, a further value j of the regulator code CNTL_REG is found at a point where the comparator 140 triggers and it is stored in the logic block 120. The two steps will be explained in more detail by referring to FIG. 8B.

Figure 8B:
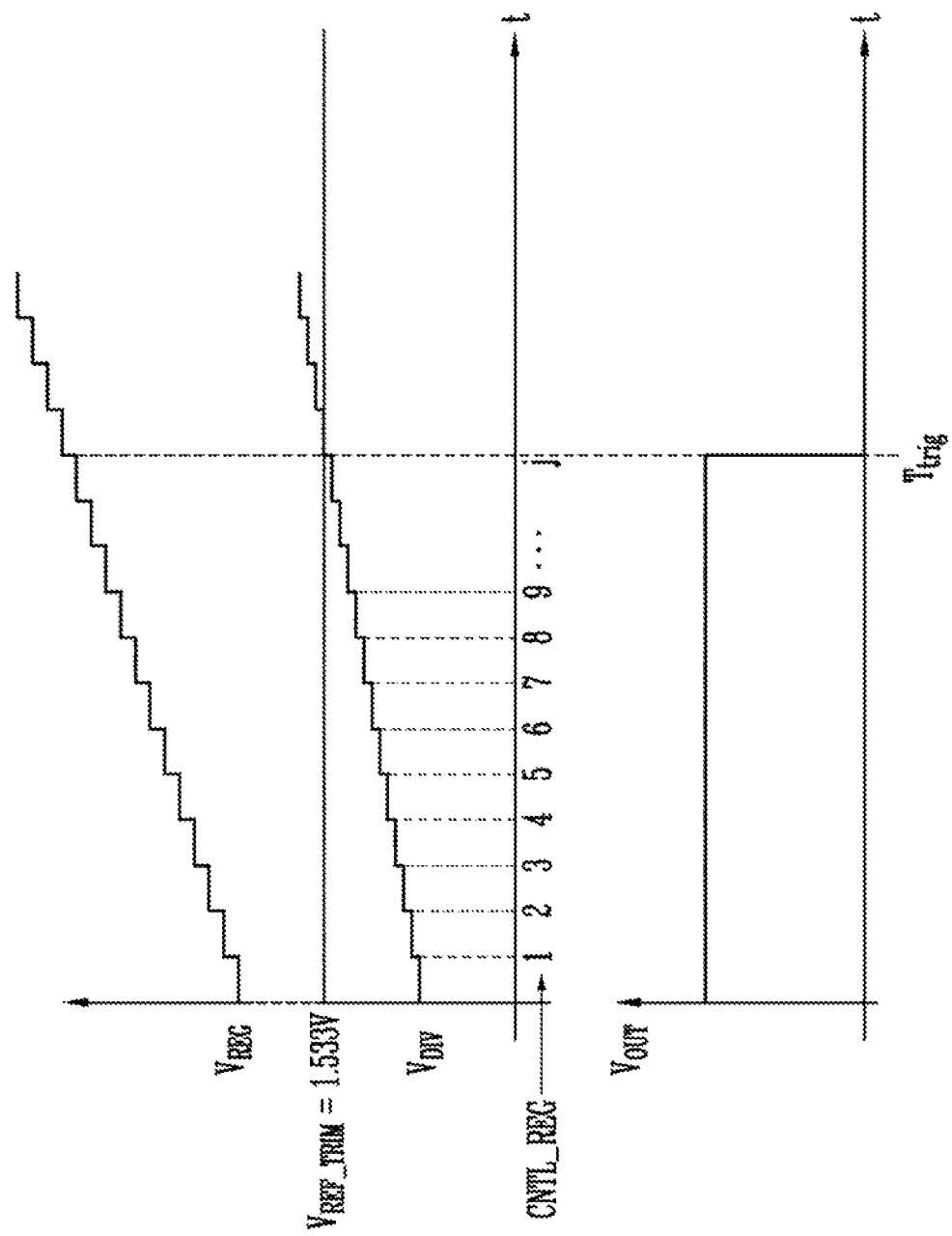
FIG. 8B schematically shows a voltage level of each component in the trimming circuit shown in FIG. 8A.

FIG. 8B schematically shows the voltage level of each component of the trimming circuit 100-4 in the working condition of FIG. 8A, i.e. when the second trimming of the voltage regulator 110 is performed. The scanning of the voltage regulator code CNTL_REG is performed, for example, by gradually or step-wisely increasing the output voltage $V_{REG}$ of the voltage regulator 110, which can be achieved by adjusting the regulator code CNTL_REG. In the embodiment, the output voltage $V_{REG}$ of the voltage regulator 110 increases as the regulator code CNTL_REG increases. For each value of the regulator code CNTL_DIV, there is a corresponding value of the output voltage $V_{REG}$ of the voltage regulator 110. Alternatively, different code schemes may be used, and the embodiment can be modified appropriately.

When the divider output voltage $V_{DIV}$ of the voltage divider 130 is lower than the trimming reference value $V_{REF\_TRIM}$, the output voltage $V_{OUT}$ of the comparator 140 is high. When the divider output voltage $V_{DIV}$ of the voltage divider 130 is higher than the trimming reference value $V_{REF\_TRIM}$, the output voltage $V_{OUT}$ of the comparator 140 is low. The triggering point $T_{trig}$ is where the output voltage $V_{OUT}$ of the comparator 140 transits from high to low. Alternatively, the triggering point $T_{trig}$ may be defined as a point where the output voltage $V_{OUT}$ of the comparator 140 transits from low to high.

In FIG. 8B, the output voltage $V_{OUT}$ of the comparator 140 is kept as high at the beginning, and the output voltage $V_{OUT}$ of the comparator 140 transits to low at a point when the divider output voltage $V_{DIV}$ of the voltage divider 130 becomes higher than the trimming reference voltage $V_{REF\_TRIM}$. This triggering occurs when the regulator code CNTL_REG is equal to J. In the embodiment, the trimming reference voltage $V_{REF\_TRIM}$ is, for example, 1.5333 V.

Referring back to FIG. 6, at the step S340, the further value j of the regulator code CNTL_REG as found for the voltage regulator 110 is stored in the logic block 120; in particular, when the regulator code CNTL_REG is equal to the further value j the comparator 140 triggers, i.e. transits from low to high. Then, at the step S350, the process transits to the step S360, because this was the second trimming.

Then, at the step S360, an average of the two values w and j of the regulator code CNTL_REG is calculated, and this average value becomes a final value of the regulator code CNTL_REG at the step S380, which value is set as a fixed regulator code CNTL_REG for the voltage regulator 110.

The reference voltages such as the trimming reference voltage $V_{REF\_TRIM}$, the divider reference voltage $V_{REF\_DIV}$, and the comparator reference voltage $V_{REF}$ can be internal or external.

The comparator's input scrambling allows minimizing the comparator offset error, where a double measure is performed by inverting the signals applied to the inputs of the comparator 140 thanks to the switching block 135.

The embodiment is applicable to the trimming of all voltage regulators and in particular to high voltage (HV) regulators, where HV means higher than 15V, typically from 15V to 25V in case of NAND memory devices. Moreover, the embodiment overcomes the limitation in trimming HV voltages, due to the lack of high voltage reference available internally or externally.

It is also possible to trim a resistor string using a reference voltage from an external pad or from an internal reference, while maintaining the same performance when applying a higher measured voltage from the voltage regulator.

According to another embodiment, it is possible to tune all internal HV regulators by simply changing the value of the used reference voltage during the regulator trimming process as above described. Therefore, the embodiment could be adopted as unique auto trimming system on board to a memory device with high trimming precision and immunity to voltage divider ratio mismatch.

Figure 9:
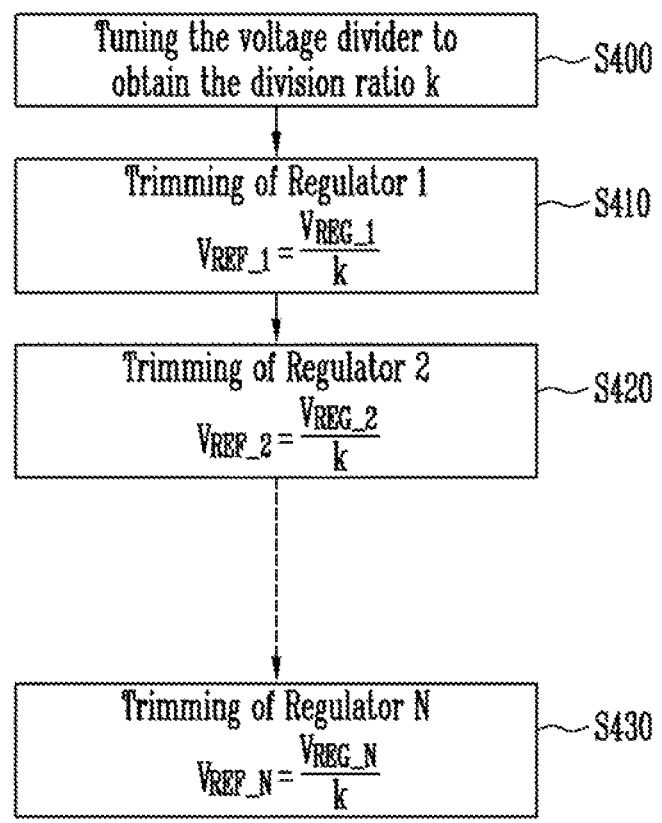
FIG. 9 shows an auto-trimming process for trimming more than one HV regulators according to an embodiment of the present invention.

FIG. 9 shows a flow chat describing an auto-trimming process for trimming more than one HV regulator using the trimming circuit 100 according to the embodiment of the present invention.

At the step S400, the voltage divider 130 is tuned to obtain a division ratio k. The voltage divider 130 can be tuned, for example, through the steps shown in the flowchart of FIG. 3 already explained. Next, a first voltage regulator, indicated as Regulator 1, is trimmed at the step S410. For the trimming of the first voltage regulator, the steps shown in the flowchart of FIG. 6 may be used. In this case, a trimming reference voltage $V_{REF\_TRIM}$ equal to $V_{REF\_1}$ is used, and the output voltage is indicated as $V_{REG\_1}$; in other words, the trimming reference voltage $V_{REF\_1}$ is equal to $V_{REG\_1}/k$.

After the trimming phase of the Regulator 1 is completed, a second voltage regulator, indicated as Regulator 2, is trimmed at the step S420. The trimming process for the Regulator 2 is performed in a similar way with that of Regulator 1. Then, the trimming process continues until the last regulator, indicated as Regulator N, is trimmed at the step S430.

Hence, in this way, more than one voltage regulators can be trimmed efficiently.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An operation method of a trimming circuit for a voltage regulator comprising a comparator and a voltage divider, the voltage divider being inserted between the voltage regulator and the comparator and connected thereto, the method comprising:
   determining a final divider code for the voltage divider by comparing a first divider output voltage and a compare reference voltage; and
   determining a final regulator code for the voltage regulator by comparing a second divider output voltage and a trimming reference voltage,
   wherein the first divider output voltage is generated by dividing a divide reference voltage according to a divider code inputted to the voltage divider, and the second divider output is generated by dividing an output voltage of the voltage regulator according to the final divider code.

2. The method of claim 1, wherein the determining the final divider code comprises:
   determining a first divider code; and
   determining a second divider code by inverting signals applied to the comparator.

3. The method of claim 2, wherein the determining the first divider code comprises:
   applying the first divider output voltage to a non-inverting input of the comparator and the compare reference voltage to an inverting input of the comparator;
   adjusting the divider code for the voltage divider until the first divider output voltage exceeds the compare reference voltage; and
   determining the divider code when the first divider output voltage exceeds the compare reference voltage as the first divider code.

4. The method of claim 2, wherein the determining the second divider code comprises:

applying the first divider output voltage to an inverting input of the comparator and the compare reference voltage to a non-inverting input of the comparator;

adjusting the divider code for the voltage divider until the first divider output voltage exceeds the compare reference voltage; and determining the divider code when the first divider output voltage exceeds the compare reference voltage as the second divider code.

5. The method of claim 2, further comprising:
determining an average of the first divider code and the second divider code as the final divider code.

6. The method of claim 1, wherein the determining the final regulator code comprises:
determining a first regulator code; and
determining a second regulator code by inverting signals applied to the comparator.

7. The method of claim 6, wherein the determining the first regulator code comprises:
applying the second divider output voltage to a non-inverting input of the comparator and the trimming reference voltage to an inverting input of the comparator;
adjusting a regulator code for the voltage regulator until the second divider output voltage exceeds the trimming reference voltage; and
determining the regulator code when the second divider output voltage exceeds the trimming reference voltage as the first regulator code.

8. The method of claim 6, wherein the determining the second regulator code comprises:
applying the second divider output voltage to an inverting input of the comparator and the trimming reference voltage to a non-inverting input of the comparator;
adjusting a regulator code for the voltage regulator until the second divider output voltage exceeds the trimming reference voltage; and
determining the regulator code when the second divider output voltage exceeds the trimming reference voltage as the second regulator code.

9. The method of claim 6, further comprising:
determining an average of the first regulator code and the second regulator code as the final regulator code.

10. A trimming circuit for a voltage regulator comprising:
a voltage divider configured to divide a divide reference voltage according to a divider code and to output a first divider output voltage;
a comparator configured to receive the first divider output voltage and a compare reference voltage and to output an output voltage of the comparator by comparing the first divider output voltage and the compare reference voltage; and
a logic unit configured to output the divider code to the voltage divider and to determine a final divider code based on the output voltage of the comparator,
wherein the voltage divider further configured to divide an output voltage of the voltage regulator according to the final divider code and to output a second divider output voltage,
wherein the comparator further configured to receive the second divider output voltage and a trimming reference voltage and to output the output voltage of the comparator by comparing the second divider output voltage and the trimming reference voltage, and
wherein the logic unit further configured to output the final divider code to the voltage divider, to output a regulator code to the voltage regulator and to determine a final regulator code based on the output voltage of the comparator.

11. The trimming circuit of claim 10, wherein the logic unit adjusts the divider code until the output voltage of the comparator is received.

12. The trimming circuit of claim 10, wherein the comparator outputs the output voltage of the comparator to the logic unit when the first divider output voltage exceeds the compare reference voltage.

13. The trimming circuit of claim 10, wherein the comparator receives the first divider output voltage via a non-inverting input and the compare reference voltage via an inverting input.

14. The trimming circuit of claim 10, wherein the comparator receives the first divider output voltage via an inverting input and the compare reference voltage via a non-inverting input.

15. The trimming circuit of claim 10, wherein the logic unit further configured to adjusts the regulator code until the output voltage of the comparator is received.

16. The trimming circuit of claim 10, wherein the comparator outputs the output voltage of the comparator to the logic unit when the second divider output voltage exceeds the trimming reference voltage.

17. The trimming circuit of claim 10, wherein the comparator receives the second divider output voltage via a non-inverting input and the trimming reference voltage via an inverting input.

18. The trimming circuit of claim 10, wherein the comparator receives the second divider output voltage via an inverting input and the trimming reference voltage via a non-inverting input.

19. The trimming circuit of claim 10, further comprising:
a switching block configured to connect the first divider output voltage with a non-inverting input of the comparator and the compare reference voltage with an inverting input of the comparator or to connect the first divider output voltage with the inverting input of the comparator and the compare reference voltage with the non-inverting input of the comparator.

20. The trimming circuit of claim 10, further comprising:
a switching block configured to connect the second divider output voltage with a non-inverting input of the comparator and the trimming reference voltage with an inverting input of the comparator or to connect the second divider output voltage with the inverting input of the comparator and the trimming reference voltage with the non-inverting input of the comparator.

* * * * *